United States Patent [19]

Sagawa

[11] Patent Number: 4,745,878
[45] Date of Patent: May 24, 1988

[54] VAPOR MASKING DEVICE

[75] Inventor: Katsuki Sagawa, Gifu, Japan

[73] Assignee: Sanyo Electric Co., Ltd., Japan

[21] Appl. No.: 931,229

[22] Filed: Nov. 14, 1986

[30] Foreign Application Priority Data

Nov. 15, 1985 [JP] Japan .................. 60-257017

[51] Int. Cl.[4] .......................................... B05C 13/02
[52] U.S. Cl. ........................... 118/505; 118/503; 118/728; 118/301; 204/298
[58] Field of Search .......... 118/503, 504, 505, 720, 118/721, 728, 301; 204/298; 427/282

[56] References Cited

U.S. PATENT DOCUMENTS 3,768,440 10/1973 Doman et al. ............... 118/503
3,897,324 7/1975 Del Monte et al. .......... 118/504
4,485,000 11/1984 Kawaguchi et al. .......... 204/298

FOREIGN PATENT DOCUMENTS 173134 11/1982 Japan .

Primary Examiner—John E. Kittle
Assistant Examiner—Alain Bashore
Attorney, Agent, or Firm—Darby & Darby

[57] ABSTRACT

A vapor masking device useable during the execution of a metal vapor depositing technique in a vacuum for masking inner and outer peripheral regions of a disc. The device comprises a support plate having a mounting opening and an annular seat protruding a slight distance radially inwardly into the mounting opening for the support of a pair of spaced discs from below in contact with a lower member of the discs, at least one disc holder for holding the discs in spaced and concentric relation to each other, and a retainer assembly having at least one access opening and adapted to be mounted on the support plate while permitting an intermediate region of an upper member of the discs between the outer and inner peripheral regions thereof to be exposed to the outside through the access opening.

7 Claims, 2 Drawing Sheets

VAPOR MASKING DEVICE

BACKGROUND OF THE INVENTION

1. Field of Technology

The present invention generally relates to the art of vapor deposition of metal in a vacuum and, more particularly, to a vapor masking device for use during the execution of a sputtering technique for forming a thin film of aluminum on discs of a kind generally known as a "Compact Disc".

2. Description of the Prior Art

Referring to FIG. 2, a compact disc D, now commercially available as a sophisticated product which may be regarded as a future substitute for the phonograph record, has outer and inner peripheral margins OM and IM which are non-recorded regions both coaxial with the center hole defined therein, a recorded region being located between these peripheral margins OM and IM. When it comes to the manufacture of the compact disc, the outer and inner peripheral regions must be masked from vapor of aluminum during the execution of a sputtering technique so that a thin film of aluminum can be deposited only on the region intermediate between the outer and inner peripheral regions.

One type of masking device hitcherto used for masking the outer and inner peripheral regions of the disc is disclosed in, for example, Japanese Laid-open Utility Model Publication No. 57-173134, published Nov. 1, 1982. According to this publication, the masking device is shown as comprising a support plate having defined therein an annular recess of a shape completely complemental to the shape of the disc and of a depth equal to the thickness thereof. This support plate includes a lid hingedly mounted on the support plate and having defined therein a circular opening of a diameter required to shield the outer peripheral region of the disc placed inside the annular recess.

This masking device also comprises a center piece having a radially outwardly extending annular flange and adapted to be removably threaded to the center mount of the support plate located radially inwardly of the annular recess, said center piece being a member separate from the support plate.

When in use, the disc is mounted in the annular recess, and the lid is then pivoted to a closed position. While only one of the opposite surfaces of the disc so mounted is exposed to the outside through the opening in the lid with the outer peripheral region of the disc concealed by the peripheral lip area of the lid around the opening, the center piece is then threaded to the center mount to permit the annular flange to conceal the inner peripheral region of the disc.

Another type of masking device also currently in use is depicted in FIG. 4. The prior art masking device so far shown includes four marking units each being generally similar in design to that disclosed in the previously mentioned publication, but differing therefrom in that the lid 22 is separate from the support plate and also in that the center piece 21 is carried by the lid 22 by means of a pair of generally U-shaped connecting bridges 23. The pair of the connecting bridges 23, each made of a slender metal rod, straddle over an annular opening between the lid 22 and the center piece 21 while extending radially in opposite directions with respect to each other, thereby retaining the center piece 21 in position within the opening in the lid 22 in coaxial relationship therewith.

In designing the masking device shown in FIG. 4, each of the connecting bridges with its opposite ends rigid with the lid 22 and the center piece 21 must protrude laterally outwardly from both the lid 22 and the center piece 21 a distance great enough to avoid the possibility that the thin film of aluminum eventually formed on the surface of the disc by the use of the sputtering technique will bear markings of the connecting bridges 23. Otherwise, the connecting bridges 23 will provide an obstruction to the deposition of the aluminum vapor on the surface of the disc with the thickness of the aluminum thin film consequently rendered irregular. The necessity of the relatively great distance over which the connecting bridges protrude laterally outwardly makes the masking device as a whole bulky in size.

SUMMARY OF THE INVENTION

Accordingly, the present invention has been developed with a view to substantially eliminating the problems inherent in the prior art masking devices and has for its essential object to provide an improved masking device compact in size and capable of accommodating at least one pair of discs during the execution of the vacuum vapor deposition.

In accordance with the present invention, there is provided an improved masking device which comprises at least one first masking means and at least one second masking means. The first masking means includes a lower first masking means for masking an inner peripheral region of a lower disc, a holder stud and a spacer both provided in the first masking means, said holder stud adapted to pass through the central opening in the lower disc and said spacer adapted to be mounted on the holder stud for forming a clearance between the lower disc and an upper disc mounted thereabove, and an upper first masking means adapted to be mounted on the holder stud for masking an inner peripheral region of the upper disc.

The second masking means includes a lower second masking means having defined therein a disc mounting opening formed with a disc receiving area for covering an outer peripheral region of the lower disc mounted in the first masking means, and an upper second masking means having defined therein an opening of a size sufficient to cover an outer peripheral region of the upper disc, then mounted in the first masking means and received in the disc mounting opening, while permitting a region of the upper disc other than it to be exposed to the outside.

In the construction according to the present invention, the outer peripheral regions of the respective discs mounted on the first masking means are retained by the second masking means and, therefore, no connecting means such as the connecting bridges used in the prior art masking device of FIG. 4 is required.

BRIEF DESCRIPTION OF THE DRAWINGS

This and other objects and features of the present invention will become clear from the subsequent description taken in conjunction with preferred embodiments thereof with reference to the accompanying drawings, in which.

DETAILED DESCRIPTION OF THE EMBODIMENTS

Figure 1A:
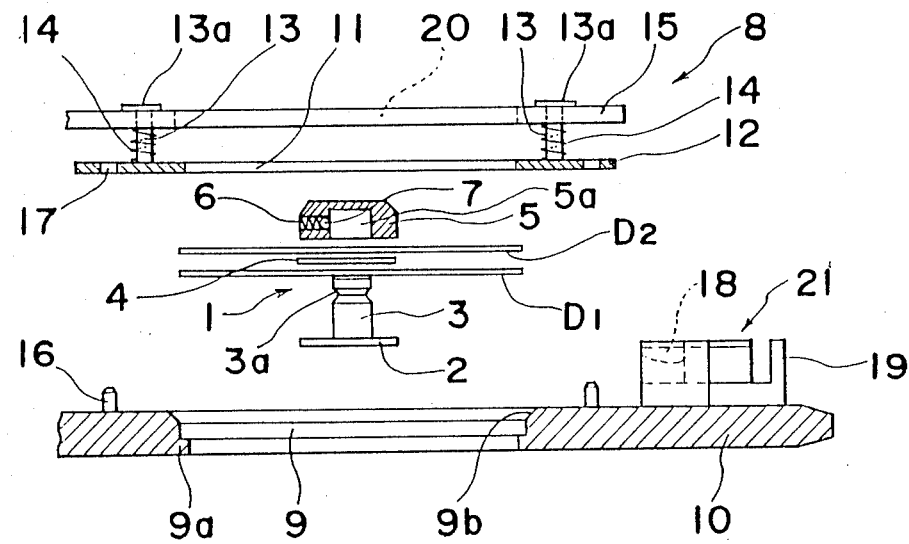
FIG. 1(a) is a partially sectioned side view of a masking device embodying the present invention shown in one operative position.
Figure 1B:
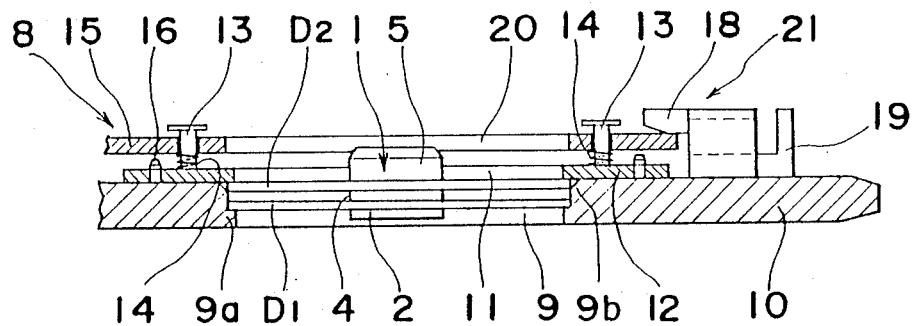
FIG. 1(b) is a view similar to FIG. 1(a), showing the masking device in another operative position.

Referring first to FIGS. 1(a) and 1(b), a masking device for use within a vacuum chamber during the execution of any known vacuum deposition technique, for example, a sputtering technique, concurrently serves as a carrier for retaining in position within the vacuum chamber discs to be vapor-deposited. The masking device shown therein comprises a disc holder, generally identified by 1, for holding a pair of discs D1 and D2 one above the other in coaxially spaced relation to each other and also for masking respective inner peripheral regions of the discs D1 and D2 around their central openings.

Figure 2:
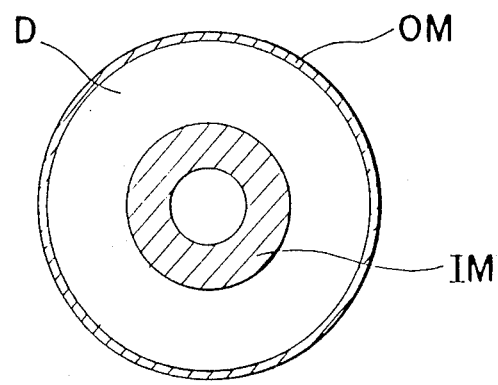
FIG. 2 is a top plan view showing the commercially available compact disc.

The disc holder 1 includes a generally cylindrical holder stud 3 of a diameter substantially equal to the inner diameter of each disc, that is, the diameter of the central opening in each disc, having one end rigidly connected, or integrally formed, with a radially outwardly extending masking flange 2, the diameter of said masking flange 2 being so chosen as to determine the desired or required width of the non-recorded inner peripheral margin IM (FIG. 2) of the disc. A portion of the holder stud 3 adjacent the opposite end thereof is formed with a circumferentially extending detent groove 3a, the function of which will be described later. It is, however, to be noted that the masking flange 2 constitutes a lower first masking means for masking the inner peripheral region of one of the discs positioned in contact therewith, that is, the lower disc D1 as viewed in FIGS. 1(a) and 1(b).

The disc holder 1 also includes an annular spacer 4 adapted to be coaxially mounted on the holder stud 3 for spacing the lower and upper discs D1 and D2 apart from each other, and a generally cylindrical masking cap 5 adapted to be removably capped onto the free end of the holder stud 3 remote from the masking flange 2. The masking cap 5 has a socket 5a defined therein for receiving the free end of the holder stud 3 and has an outer diameter equal to the diameter of the masking flange 2, said masking cap 5 constituting an upper masking means for masking the inner peripheral region of the upper disc D2.

The masking cap 5, constituting an upper first masking means for masking the inner peripheral region of the upper disc D2, can be clicked onto the free end of the holder stud 3 to avoid any possible accidental separation of it from the holder stud 3, and for this purpose, the masking cap 5 carries a detent ball 7 which is accommodated in a radial bore defined in the cap 5 and which is normally biased by a biasing spring 6, accommodated in the radial bore, so as to partially protrude into the socket 5a. Thus, when the masking cap 5 is mounted on the holder stud 3 with the free end of said stud 3 snugly received in the socket 5a, the detent ball 7 is collapsibly engaged in the detent groove 3a on the holder stud 3 to permit the cap 5 to be retained on the stud 3.

The disc holder 2 of the above described construction is so designed as to retain the lower and upper discs D1 and D2 in coaxially spaced relation to each other after the lower and upper discs D1 and D2 have been successively mounted on the holder stud 3 with the annular spacer 4 positioned therebetween and the masking cap 5 has subsequently been capped onto the free end of the holder stud 3 as shown in FIG. 1(b).

The masking device also comprises a support plate 10 preferably of a thickness slightly greater than the sum of the respective thicknesses of the lower and upper discs D1 and D2 and the thickness of the spacer 4 and has defined therein a disc mounting opening 9 of a diameter substantially equal to the outer diameter of each disc D1 and D2, with a peripheral wall defining the mounting opening 9 being so configured as to have an annular seat 9a radially inwardly protruding therefrom at a lower end of the mounting opening 9. A peripheral edge portion of the support plate 10 around the mounting opening 9 which is located remote from the annular seat 9a is outwardly flared at 9b to a diameter greater than the outer diameter of each disc D1 and D2 wherefore the discs D1 and D2 mounted on the disc holder 1 in the manner as hereinabove discribed can be readily received in the mounting opening 9. In other words, the presence of the flared edge 9b around the mounting opening 9 can facilitate the quick mounting of the discs D1 and D2, carried by the disc holder 1, into the mounting opening 9. It is to be noted that, with the discs D1 and D2 received within the mounting opening 9 as best shown in FIG. 1(b), the outer peripheral region of the lower disc D1 rests on and is masked by the annular seat 9a of a width so chosen as to determine the desired or required width of the nonrecorded outer peripheral margin OM (FIG. 2) of the disc while an upper surface of the upper disc D2 opposite to the lower disc D1 is held flush with an upper surface of the support plate 10. This annular seat 9a integral with the support plate 10 constitutes a lower second masking means for masking the outer peripheral region of the lower disc D1.

The masking device further comprises a retainer assembly generally identified by 8 and comprised of a cover plate 12 and a retainer plate 15 positioned one above the other so as to lie in parallel relation to each other. The cover plate 12 has defined therein an access opening 11 of a diameter which is equal to the diameter of the mounting opening 9 less twice the width of the annular seat 9a, so that the outer peripheral region of the upper disc D2 can be masked thereby as will be described later. The retainer plate 15 is also formed with an access opening 20 of a diameter greater than that of the access opening 11 in the cover plate 12 and carries the cover plate 12 for movement relative to the cover plate 12 in a direction close towards and away from such cover plate 12. Specifically, at least two headed cotter pins 13, each having a head 13a at one end thereof, are loosely passed through the retainer plate 15 at locations on opposite sides of the access opening and are then welded or screwed to the cover plate 12 while the access openings 11 and 20 are aligned with each other. The cover plate 12 and the retainer plate 15 so connected together are collapsibly kept spaced from each other by biasing springs 14 interposed therebetween around the cotter pins 13. In this condition, the retainer plate 15 is urged against the respective heads 13a of the cotter pins 13 without being separated from the cover plate 12.

For centering the retainer assembly 8 relative to the support plate 10 with the access openings 11 and 20 aligned exactly with the mounting opening 9, the support plate 10 has a pair of spaced positioning pins 16 rigidly mounted thereon so as to protrude at right angles thereto and so as to be engaged into respective positioning holes 17 defined in the cover plate 12.

It is to be noted that the cover plate 12 constitutes an upper second masking means for masking the outer peripheral region of the upper disc D2.

For retaining the retainer assembly 8 in a closed position, as shown in FIG. 1(b), with the cover plate 12 held in contact with the support plate 10 after the pair of discs D1 and D2 carried by the disc holder 1 have been mounted in the mounting opening 9, at least two identical latches 21, only one of which is shown, are employed. Each latch 21 comprises amount 19, rigidly mounted on the support plate 10, and a latch bar 18 slidably supported by the mount for movement between a retracted position, shown in FIG. 1(a), and a projected position shown in FIG. 1(b) in a direction radially of the mounting opening 9.

As can be understood from FIG. 1(b), after the retainer assembly 8 has been mounted on the support plate 10 with the discs D1 and D2 accommodated within the mounting opening 9 together with the disc holder 1, and the latch bars 18 of the respective latches 21 have subsequently slid from the retracted position to the projected position, the retainer assembly 8 is retained in the closed position with the latch bars 18 partially riding over the retainer plate 15 while depressing the retainer plate 15 slightly against the biasing springs 14 towards the cover plate 12. Thus, it is clear that, while the inner peripheral regions of the lower and upper discs D1 and D2 are masked by the masking flange 2 and the masking cap 5, respectively, the outer peripheral region of the same discs D1 and D2 are masked by the annular seat 9a integral with the support plate 10 and an inner peripheral area of the cover plate 12 around the access opening 11, respectively. The masking device carrying the discs D1 and D2 is then placed in a known vacuum chamber for the execution of any known vapor deposition technique, for example, a sputtering technique. So far shown, only respective surfaces of the lower and upper discs D1 and D2 facing in opposite directions away from each other are, within the vacuum chamber, exposed to the vapor of metal, for example, aluminum which is eventually deposited on the intermediate region of each disc which has been rendered accessible to the metal vapor through the associated opening 9 or 11.

Figure 3:
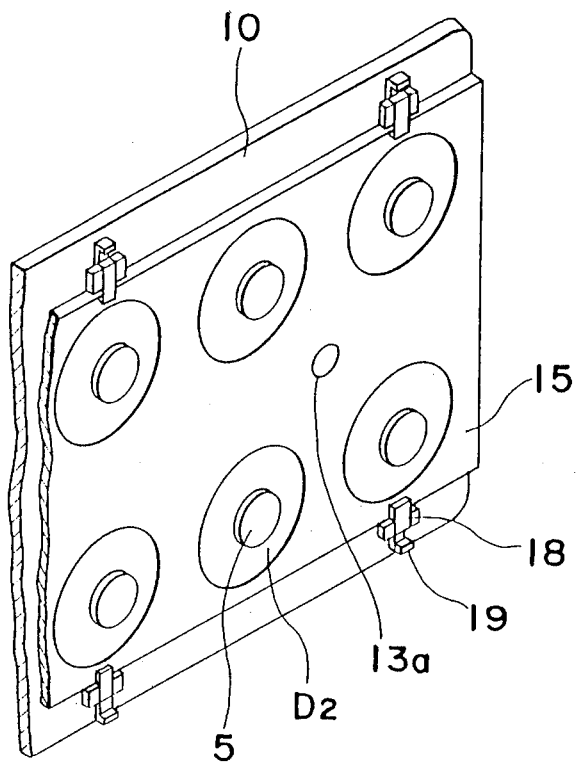
FIG. 3 is a perspective view of a portion of the masking device according to another embodiment of the present invention.

The masking device shown in and described with reference to FIGS. 1(a) and 1(b) is so designed as to accommodated only one pair of discs at a time. However, it may be so designed as to accommodate a plurality of pairs of the discs as shown in FIG. 3. In the embodiment shown in FIG. 3 wherein like parts used in FIG. 3 are designated by like reference numerals used in FIGS. 1(a) and 1(b), the disc holder 1 is required in a number equal to the number of the pairs of the discs accommodatedable by the masking device, and the support plate 10 has the mounting opening 9 equal to the number of the disc holders 1 used. Similarly, any one of the cover plate 12 and the retainer plate 15 has the associated access opening 11 or 20 equal in number to the mounting openings 9 in the support plate 10.

Figure 4:
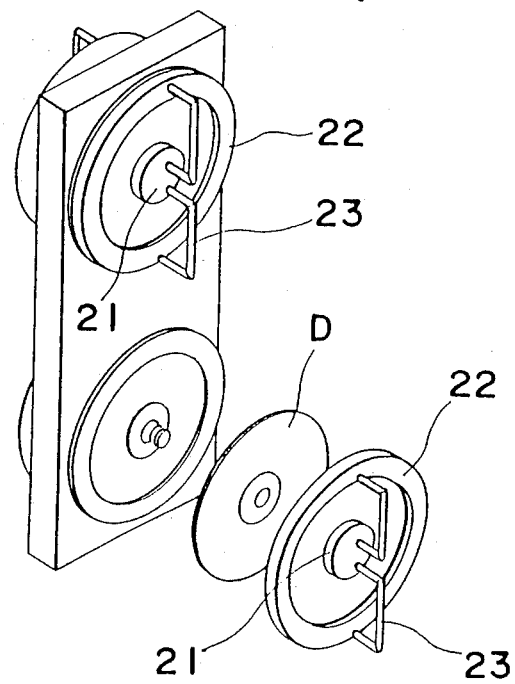
FIG. 4 is a perspective view of the prior art masking device, reference to which has been made.

From the foregoing description of the present invention, it has now become clear that, in the prior art device shown in and described with reference to FIG. 4, the discs must be mounted individually from opposite directions one at a time. The device according to the present invention is convenient in that the or each pair of the discs can be mounted simultaneously from one lateral direction after they have been mounted on the disc holder.

Although the present invention has been fully described inconnection with the preferred embodiment thereof with reference to the accompanying drawings, it is to be noted that various changes and modifications are apparent to those skilled in the art. By way of example, although the retainer assembly has been shown and described as comprised of the cover plate and the retainer plate connected together for elastically yieldable displacement relative, in a direction close towards and away from, each other, it may be comprised of only the cover plate.

Accordingly, such changes and modifications are to be understood as included within the scope of the present invention as defined by the appended claims, unless they depart therefrom.

What is claimed is:

1. A vapor masking device comprising in combination:
   at least one first masking means including a lower first masking means for masking an inner peripheral region of a first disc, a holder stud provided in the first masking means, said holder stud being adapted to pass through a central opening in the first disc and then through a central opening in the second disc while supporting said first and second discs one above the other in spaced relationship with each other, an upper first masking means adapted to be mounted on the holder stud for masking an inner peripheral region of the upper disc; and
   a second masking means including a lower seond masking means having defined therein a disc mounting opening formed with a disc receiving area for covering an outer peripheral region of the first disc mounted in the first masking means, and an upper second masking means including a cover plate having defined therein an opening of sufficient size to expose to the outside all but an outer peripheral region of the second disc when the first masking means holding the first disc and second disc is removably placed in the second masking means.

2. A vapor masking device according to claim 1 wherein a spacer is provided in the first masking means, said spacer is adapted to be mounted on the holder stud for forming a clearance between the first disc and the second disc.

3. A vapor masking device comprising in combination
   at least one disc holder for holding a pair of indentical discs each having a central opening defined therein, said disc holder adapted to hold the pair of the discs in spaced and concentric relation to each other with respective inner peripheral regions of said discs covered thereby;
   a support plate having at least one mounting opening defined therein, said support plate also having an annular seat protruding a predetermined distance radially inwardly into the mounting opening adjacent one of the opposite surfaces of said support plate, said mounting opening being adapted to accommodate the pair of discs, carried by the disc holder, with an outer peripheral region of one of the discs resting on the annular seat adjacent said one of the opposite surfaces of the support plate;

a generally plate-like retainer assembly having at least one access opening defined therein of a diameter which is equal to the diameter of the mounting opening less twice the width of the annular seat, said retainer assembly being, after the pair of the discs carried by the disc holder have been placed inside the mounting opening, placed over the support plate with the access opening concentrically aligned with said mounting opening in the support plate to cover an outer peripheral region of the other of the discs; and means for positioning the retainer assembly relative to the support plate in a manner with the access opening concentrically aligned with the mounting opening.

4. The device as claimed in claim 2, wherein the disc holder comprises a holder stud of a diameter equal to the diameter of the central opening in each disc, said stud having one end formed with a masking flange protruding radially outwardly therefrom to a predetermined diameter, a masking cap of a diameter equal to the predetermined diameter of the masking flange, said masking cap adapted to be removably mounted on the other end of the stud, and an annular spacer adapted to be mounted between the discs around the stud to keep the discs in spaced relation to each other.

5. The device as claimed in claim 3, wherein a peripheral edge portion of the support plate defining the mounting opening remote from the annular seat and adjacent the other of the opposite surfaces of the support plate is radially outwardly flared.

6. The device as claimed in claim 3, further comprising at least two latches operable to connect the support plate and the retainer assembly together with the discs, carried by the disc holder, retained within the mounting opening.

7. The device as claimed in claim 3, wherein the retainer assembly comprises a cover palte and a retainer plate connected together in parallel and spaced relation to each other for elastically yieldable displacement in a direction close towards and away from each other, said cover and retainer plates having defined therein respective concentric openings which altogether constitute said access opening of the retainer assembly.

* * * * *